(12) United States Patent
Wu

(10) Patent No.: US 7,796,188 B2
(45) Date of Patent: Sep. 14, 2010

(54) COMPACT IMAGE SENSOR PACKAGE AND METHOD OF MANUFACTURING THE SAME

(75) Inventor: Ying-Cheng Wu, Taipei Hsien (TW)

(73) Assignee: Hon Hai Precision Industry Co., Ltd., Tu-Cheng, Tapiei Hsien (TW)

( * ) Notice: Subject to any disclaimer, the term of this patent is extended or adjusted under 35 U.S.C. 154(b) by 329 days.

(21) Appl. No.: 11/871,925

(22) Filed: Oct. 12, 2007

(65) Prior Publication Data

US 2008/0252760 A1 Oct. 16, 2008

(30) Foreign Application Priority Data

Apr. 10, 2007 (CN) .......................... 2007 1 0200417

(51) Int. Cl.
*H04N 5/225* (2006.01)
(52) U.S. Cl. ..................................... 348/374
(58) Field of Classification Search .................. 348/374
See application file for complete search history.

(56) References Cited

U.S. PATENT DOCUMENTS

| 5,122,861 | A | * | 6/1992 | Tamura et al. ............... 257/434 |
| 7,183,589 | B2 | * | 2/2007 | Kameyama et al. ......... 257/100 |
| 7,262,405 | B2 | * | 8/2007 | Farnworth et al. .......... 250/239 |
| 7,423,689 | B2 | * | 9/2008 | Kim et al. .................... 348/374 |
| 7,456,901 | B2 | * | 11/2008 | Jeong et al. .................. 348/374 |
| 7,554,599 | B2 | * | 6/2009 | Tu et al. ....................... 348/340 |
| 2004/0179243 | A1 | * | 9/2004 | Hsieh et al. ................... 358/474 |
| 2005/0099531 | A1 | * | 5/2005 | Wu et al. ..................... 348/374 |
| 2005/0285016 | A1 | * | 12/2005 | Kong et al. ............... 250/208.1 |
| 2006/0290802 | A1 | | 12/2006 | Webster et al. |

FOREIGN PATENT DOCUMENTS

| CN | 1567592 A | 1/2005 |
| CN | 1873992 A | 12/2006 |

* cited by examiner

*Primary Examiner*—James M Hannett
(74) *Attorney, Agent, or Firm*—Jeffrey T. Knapp

(57) ABSTRACT

An exemplary image sensor package includes a base, an image sensor chip, a bonding layer, and an imaging lens. The image sensor chip is disposed on the base. The image sensor chip includes a photosensitive area. The bonding layer is disposed on at least one of the image sensor chip and the base. The bonding pads surround the photosensitive area. The imaging lens is adhered onto the bonding layer and hermetically seals the photosensitive area with the bonding layer. The imaging lens is configured for forming images on the photosensitive area. The present invention also relates to a method for manufacturing the image sensor package.

22 Claims, 5 Drawing Sheets

COMPACT IMAGE SENSOR PACKAGE AND METHOD OF MANUFACTURING THE SAME

TECHNICAL FIELD

The present invention relates to image sensor packages and, particularly, to an image sensor package having a compact structure and a relatively high image quality, and a method for manufacturing the image sensor package.

BACKGROUND

With the ongoing development of micro-circuitry and multimedia technology, digital cameras have now entered widespread use. High-end portable electronic devices, such as mobile phones and PDAs (Personal Digital Assistants), are being developed to be increasingly multi-functional. Many of these portable electronic devices are equipped with digital cameras. A key component of the digital cameras is an image sensor, which is a kind of electro-optical device. To facilitate portability, packaging for the image sensor tends to be compact, slim, and light.

FIG. 5 illustrates a typical image sensor package 11 incorporated in a camera module 100. The camera module 100 includes a lens module 12, a transparent cover 18, and the image sensor package 11. The image sensor package 11 includes a base 13 and an image sensor chip 15 adhered onto the base 13 via an adhesive 17. The base 13 includes a substrate 131 and a plurality of frames 132 around the image sensor chip 15. The transparent cover 18 is disposed on the frames 132. The lens module 12 is mounted onto the transparent cover 18. The transparent cover 18 and the base 13 cooperatively form a sealed chip cavity 133. The image sensor chip 15 is received in the sealed chip cavity 133.

However, the chip cavity 133 is prone to having a much larger space than the image sensor chip 15 because of height of the frames 132 and length of the wires 123. Therefore, dimension of the image sensor package 11 cannot be efficiently used. Furthermore, due to the larger chip cavity 133, the photosensitive area 151 may easily become contaminated by dust, particles, moisture and other environmental factors. This would impact on image sensitive quality of the image sensor package 11.

What is needed, therefore, is an image sensor package that has a compact structure and a relatively high image quality.

What is needed, also, is a method for manufacturing the image sensor package.

SUMMARY

In accordance with an embodiment, an image sensor package includes a base, an image sensor chip, a bonding layer, and an imaging lens. The image sensor chip is disposed on the base. The image sensor chip includes a photosensitive area. The bonding layer is disposed on at least one of the image sensor chip and the base. The bonding pads surround the photosensitive area. The imaging lens is adhered onto the bonding layer and is configured for forming imaging light signals onto the photosensitive area. The imaging lens cooperates with the bonding layer to hermetically seal the photosensitive area.

A method of manufacturing the image sensor package includes steps as follows. Providing a base. Assembling an image sensor chip on the base, the image sensor chip comprising a photosensitive area. Disposing a bonding layer on at least one of the image sensor chip and the base, the bonding layer surrounding the photosensitive area. Adhering an imaging lens onto the bonding layer, the imaging lens cooperating with the bonding layer to hermetically seal the photosensitive area.

Other advantages and novel features will be drawn from the following detailed description of at least one present embodiment, when considered in conjunction with the attached drawings.

BRIEF DESCRIPTION OF THE DRAWINGS

Many aspects of the present image sensor package, manufacturing method thereof, and camera module can be better understood with reference to the following drawings. The components in the drawings are not necessarily drawn to scale, the emphasis instead being placed upon clearly illustrating the principles of the present image sensor package and the camera module. Moreover, in the drawings, like reference numerals designate corresponding parts throughout the several views.

DETAILED DESCRIPTION OF THE PREFERRED EMBODIMENT

Embodiments of the present image sensor package, manufacturing method thereof, and camera module will now be described in detail below and with reference to the drawings.

Figure 1:
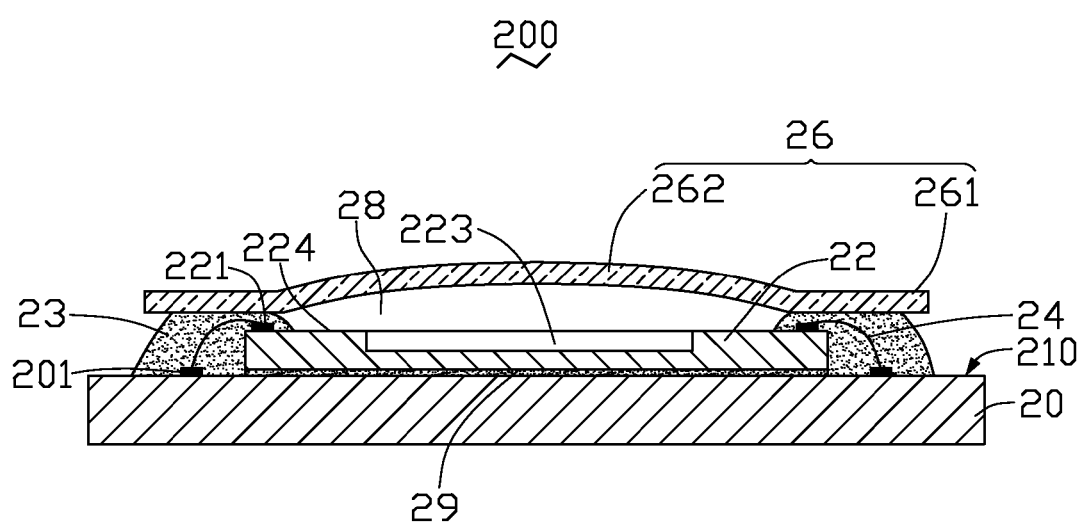
FIG. 1 is a schematic, cross-sectional view of an image sensor package, according to a first present embodiment.

FIG. 1 illustrates an image sensor package 200, in accordance with a first present embodiment. The image sensor package 200 includes a base 20, an image sensor chip 22, a bonding layer 23, and an imaging lens 26. The image sensor chip 22 is disposed on the base 20. The bonding layer 23 is disposed on at least one of the image sensor chip 22 and the base 20. The imaging lens 26 is fixed on the bonding layer 23.

The base 20 is, advantageously, a printed circuit board. The base 20 has a top surface 210. A plurality of base pads 201 is disposed on the top surface 210 of the base 20 and surrounds the image sensor chip 22. The base 20 is, beneficially, made of a material selected from the group consisting of: polyester, polyimide, ceramic, and glass fiber.

The image sensor chip 22 is, advantageously, a charged coupled device (CCD), or a complementary metal-oxide-semiconductor transistor (CMOS). The image sensor chip 22 is able to convert the received light signals into digital electrical signals.

The image sensor chip 22 could, advantageously, be adhered onto the base 20, e.g., via an adhesive layer 29. The adhesive layer 29 is, usefully, an antisotropic conductive paste (ACP) or an antisotropic conductive film (ACF). Alternatively, the adhesive layer 29 could be replaced by any other appropriate fixing means such as, for example, metallurgical means.

The image sensor chip 22 has an upper surface facing the imaging lens 26. The image sensor chip 22 includes a photosensitive (i.e., active) area 223 disposed on the upper surface and a non-photosensitive area 224 around the photosensitive area 223. The photosensitive area 223 is configured (i.e., structured and arranged) for receiving light signal transmitted through the imaging lens 26.

A plurality of chip pads 221 is disposed around the photosensitive area 223. Each chip pad 221 is electrically connected to a corresponding base pad 201, e.g., via a respective wire 24. The wires 24 are, advantageously, made of a conductive material, such as gold, silver, aluminum, or an alloy thereof.

The bonding layer 23 is, advantageously, made of an adhesive material, for example, a silicone, epoxy, acrylic, or polyamide adhesive. The bonding layer 23 advantageously covers at least one of the chip pads 221 and the base pads 201. In the illustrated embodiment, the bonding layer 23 covers the chip pad 221, the base pads 201, and the wires 24, in order to protect the wires 24 from metal fatigue, ensure the connections between the ends of the wires 24 and the two pads 221, 201, and to adequately insulate the individual wires 24 to help avoid potential shorting.

Alternatively, the bonding layer 23 could be applied to a peripheral edge of the top surface 210 of the base 20 and be apart from the base pads 201. Alternatively, the bonding layer 23 could be applied to the non-photosensitive area 224 and be interposed between the photosensitive area 223 and the chip pads 221.

The imaging lens 26 hermetically seals the photosensitive area and is configured for forming an imaging light signal onto the photosensitive area 223. The imaging lens 26 is, beneficially, selected from the group consisting of: an aspheric lens, a spherical lens, and a converging lens. The imaging lens 26 includes a centric optical portion 262 and a peripheral non-optical portion 261 around the optical portion 262. The optical portion 262 is, advantageously, a vaulted structure and is spaced from the photosensitive area 223 at a predetermined distance. The predetermined distance substantially depends on a height of the vaulted optical portion 262 with respect to the photosensitive area 223.

The imaging lens 26 and the bonding layer 23 cooperatively form a protective package around the photosensitive area 223, thereby defining a sealed interspace 28 above the photosensitive area 223. The height of the vaulted optical portion 262 is lower. Thus, the interspace 28 has a relatively smaller space, depending on the lower height of the vaulted optical portion 262. Therefore, the photosensitive area 223 has little risk of being contaminated by dust, particles, moisture and other environmental factors. As such, the image sensor package 200 has an enhanced reliability and a relatively high image quality.

On one hand, the imaging lens 26 is fixed on the image sensor chip 22 via the bonding layer 23. Accordingly, total height of the image sensor package 200 is reduced, thus achieving a compact image sensor package 200. On the other hand, the imaging lens 26 functions as a cover configured for protecting the photosensitive area 223 and an imaging member configured for forming an imaging light signal onto the photosensitive area 223. Therefore, the image sensor package 200 is also a compact camera module, without requiring any special lens module engaging with the image sensor package 200.

Figure 2:
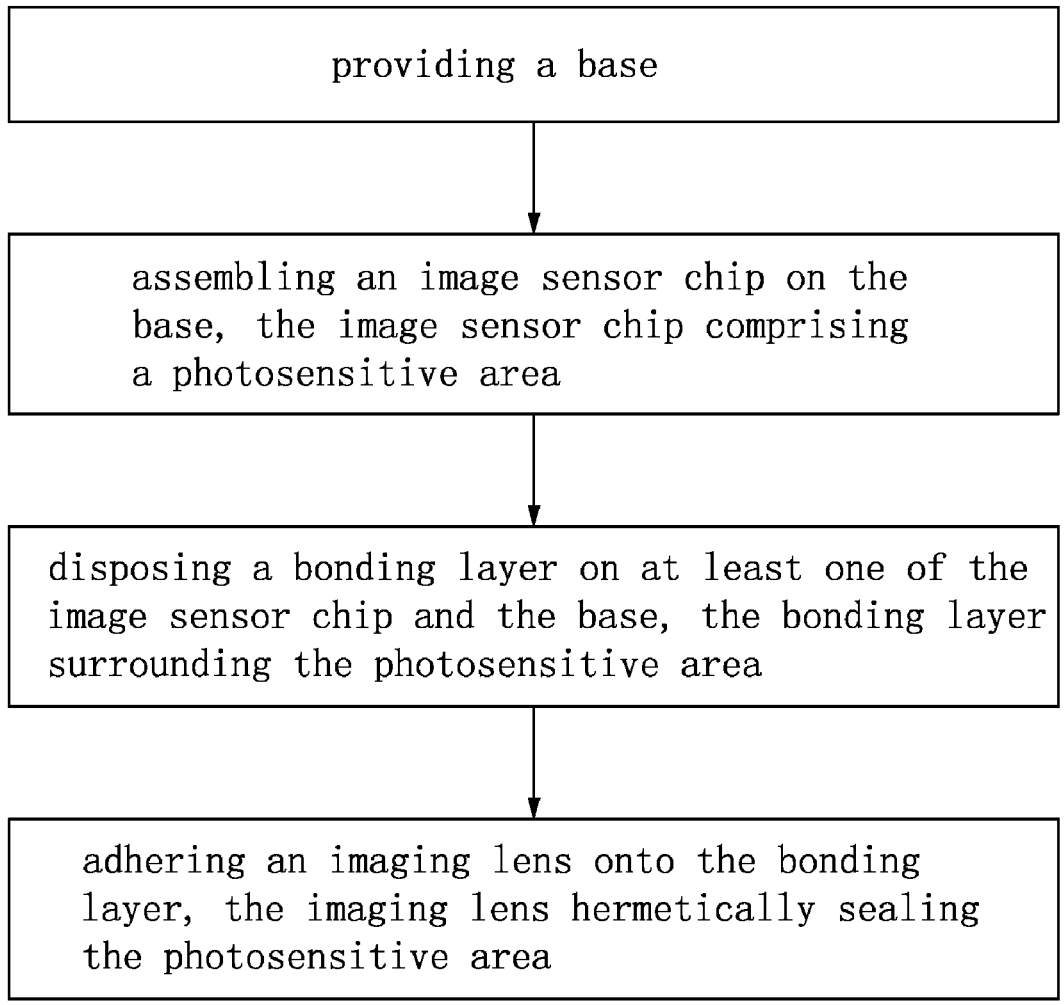
FIG. 2 is a flow chart of a method of manufacturing the image sensor package of FIG. 1.

FIG. 2 illustrates a flow chart of a method for manufacturing the image sensor package 200. The method includes the steps as follows. Providing a base 20. Assembling an image sensor chip 22 on the base 20, the image sensor chip 22 including a photosensitive area 223. Disposing a bonding layer 23 on at least one of the image sensor chip 22 and the base 20, the bonding layer 23 surrounding the photosensitive area 223. Adhering an imaging lens 26 onto the bonding layer 23, the imaging lens 26 hermetically sealing the photosensitive area 223. As such, assembly of the image sensor package 200 is completed.

The image sensor chip 22 is, usefully, assembled on the base 20, by a package process, for example, a chip-scale package process, a wafer-level chip-scale package process, a ceramic leaded package process, a plastic leadless chip package process, a thermal compression bonding process, or a flip chip package process.

The adhesive material is disposed on the image sensor chip 22, for example, using an adhesive dispenser.

The imaging lens 26 is, usefully, fixed on the image sensor chip 22 by adhering the non-optical portion 261 onto the bonding layer 23. The imaging lens 26 is, advantageously, adjusted by, for example, sliding the non-optical portion 261 on the bonding layer 23, in order to ensure that an optical axis of the optical portion 262 is aligned with an optical axis of the photosensitive area 223. Then, the adhesive material is solidified by, e.g., ultraviolet radiation or heating. Thus, the imaging lens 26, the image sensor chip 22, and the base 20 are integrated with each other via the bonding layer 23. Accordingly, the desired assembly of image sensor package 200 is completed.

Figure 3:
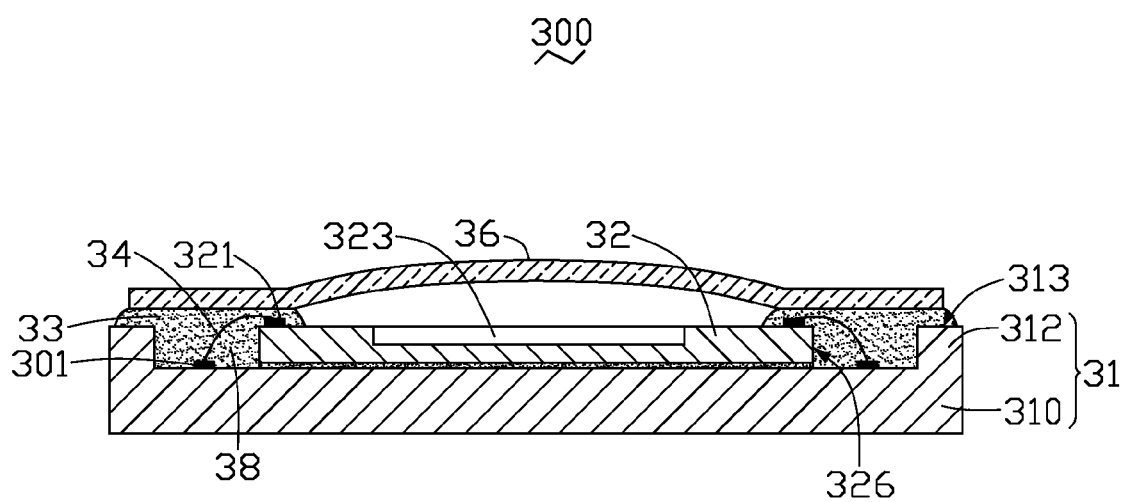
FIG. 3 is a schematic, cross-sectional view of an alternative image sensor package, according to a second present embodiment.

FIG. 3 illustrates an alternative image sensor package 300, in accordance with a second present embodiment. The image sensor package 300 includes a base 31, an image sensor chip 32, a bonding layer 33, and an imaging lens 36. The image sensor chip 32, the bonding layer 33, and the imaging lens 36 are similar to the image sensor chip 22, the bonding layer 23, and the imaging lens 26 of the first embodiment, respectively. The image sensor chip 32 has a photosensitive area 323, a plurality of chip pads 321 mounted on a non-photosensitive area around the photosensitive area 323, and a plurality of sidewalls 326.

In this embodiment, the base 31 includes a substrate 310 and a plurality of protectors 312. Each protector 312 has a top face 313. The protectors 312 advantageously protrude out of peripheral edges of the substrate 310 along a direction substantially perpendicular to the substrate 310. The protectors 312 usefully have a height, substantially equal to a height of the image sensor chip 32.

The protectors 312 are, beneficially, spaced from and parallel to respective sidewalls 326 of the image sensor chip 32, respectively. Thus, an interspace 38 is defined between the protectors 312 and the sidewalls 326 and is disposed around the image sensor chip 32. A plurality of base pads 301 is disposed on the substrate 310 in the interspace 38. The bonding layer 33 is, advantageously, inserted to the point of overbrimming the interspace 38. The bonding layer 33 usefully covers the base pads 301 of the base 20, the top faces 313 of the projectors 312, chip pads 321 of the image sensor chip 32, and wires 34 electrically connecting the two pads 321 and 301.

The manufacturing method of the image sensor package 300 is essentially similar to the manufacturing method of the image sensor package 200 in the first present embodiment, except for additional formation of the projectors 312 on the substrate 310. The projectors 312 are, advantageously, co-molded with the substrate 310, thereby obtaining the base 31. Alternatively, the projectors 312 could be formed on edges of the substrate 310 via, e.g., an adhesive or a solder.

Figure 4:
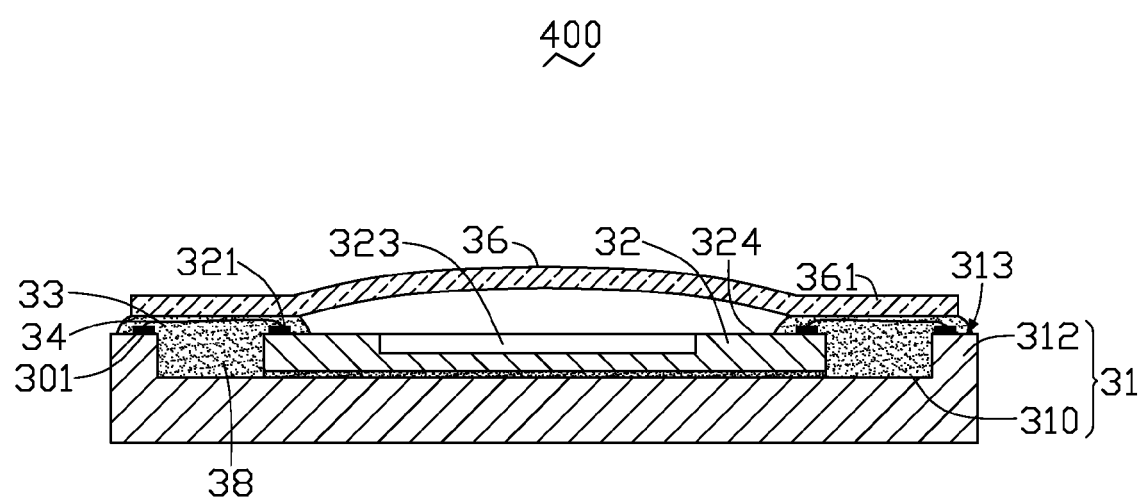
FIG. 4 is a schematic, cross-sectional view of another alternative image sensor package, according to a third present embodiment.
Figure 5:
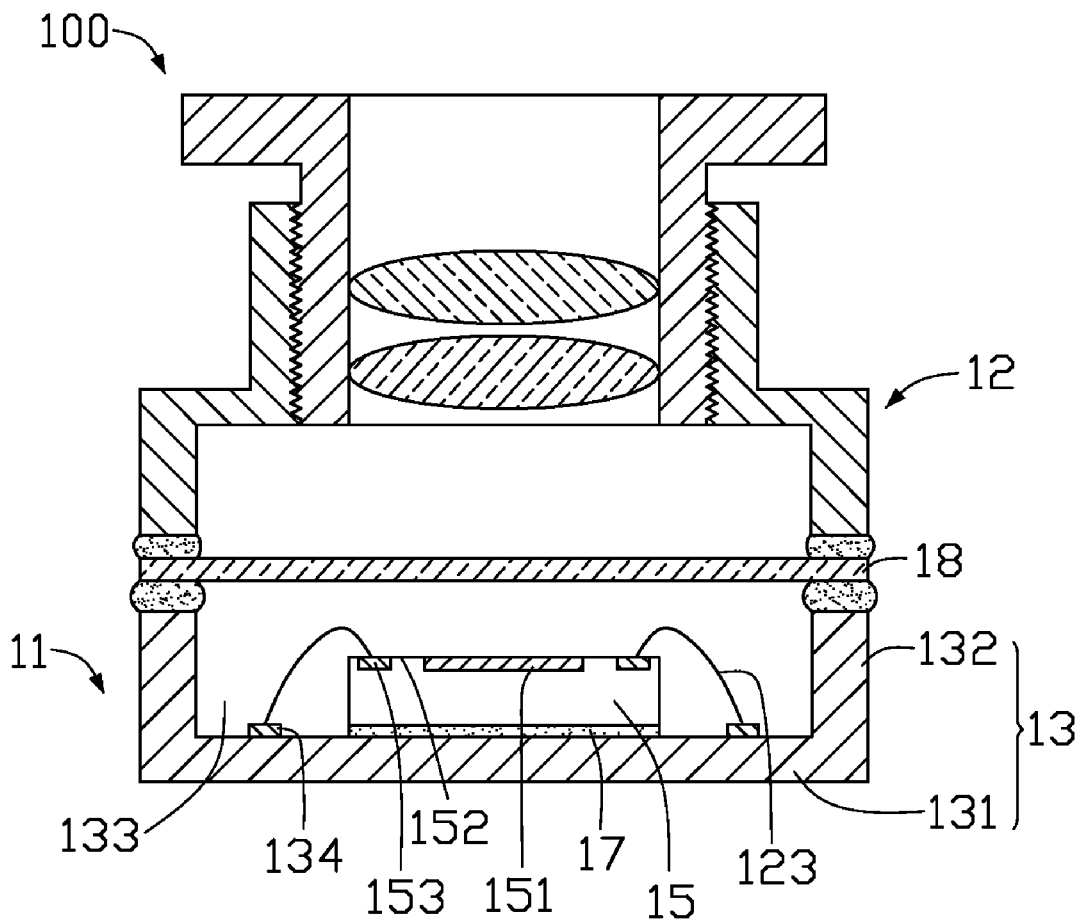
FIG. 5 is a schematic, cross-sectional view of a conventional image sensor package.

FIG. 4 illustrates another alternative image sensor package 400, in accordance with a third present embodiment. The image sensor package 400 is essentially similar to the image sensor package 300 in the second embodiment, except for the base pads 301. In this embodiment, the base pads 301 are disposed on the top faces 313 of the projectors 312, accordingly facilitating formation of electrical connection between the two pads 321, 301. The bonding layer 33 advantageously covers the chip pads 321, the wires 34, and the base pads 301 on the top face 313.

The manufacturing method of the image sensor package 400 is essentially similar to the manufacturing method of the image sensor package 300 in the second present embodiment, except for formation of the base pads 301. The base pads 301 are formed on the top face 313 of the projectors 312. The chip pads 321 are electrically connected to the base pads 301 with wires 34, e.g., using a ball stitch on ball (BSOB) technique and a wire bonding equipment.

Around the top face 313 of the projectors 312, sufficient free space can be provided for operating the wire bonding equipment, thereby improving bonding reliability of the wires 34. Otherwise, distance between each sidewall 326 of the image sensor chip 32 and one respective projector 312 can be reduced, accordingly minimizing the image sensor package 400.

It will be understood that the above particular embodiments and methods are shown and described by way of illustration only. The principles and features of the present invention may be employed in various and numerous embodiments thereof without departing from the scope of the invention as claimed. The above-described embodiments illustrate the scope of the invention but do not restrict the scope of the invention.

What is claimed is:

1. An image sensor package comprising:
   a base;
   an image sensor chip disposed on the base, the image sensor chip comprising a photosensitive area;
   a bonding layer disposed on at least one of the image sensor chip and the base, the bonding layer surrounding the photosensitive area; and
   an imaging lens adhered onto the bonding layer and configured for forming imaging light signals onto the photosensitive area, the imaging lens cooperating with the bonding layer to hermetically seal the photosensitive area and a sealed interspace being formed between the bottom of the imaging lens and the image sensor, the sealed interspace being sealed using the bonding layer and not filled with solid material.

2. The image sensor package as claimed in claim 1, wherein a plurality of chip pads is disposed on the image sensor chip around the photosensitive area; a plurality of base pads is disposed on the base; each base pad is electrically connected to a respective chip pad via a wire; the bonding layer covers the chip pads, the base pads and the wires.

3. The image sensor package as claimed in claim 1, wherein the base comprises a substrate and a plurality of projectors protruding out of edges of the substrate along a direction substantially parallel to an optical axis of the imaging lens.

4. The image sensor package as claimed in claim 3, wherein the projectors are apart from and surround the image sensor chip, accordingly defining an interspace therebetween; the bonding layer is inserted to a point where it overbrims the interspace.

5. The image sensor package as claimed in claim 3, wherein the image sensor chip comprises a plurality of chip pads disposed around the photosensitive area; the substrate comprises a plurality of base pads interposed between the image sensor chip and the projectors, each base pad being electrically connected to a respective chip pad via a wire.

6. The image sensor package as claimed in claim 5, wherein the bonding layer covers at least one of the chip pads and the base chips.

7. The image sensor package as claimed in claim 5, wherein the bonding layer covers the chip pads, the base chips, and the wires.

8. The image sensor package as claimed in claim 3, wherein a plurality of chip pads is disposed around the photosensitive area of the image sensor chip; a plurality of base pads are disposed on the projectors corresponding to the plurality of chip pads; each base pad is electrically connected to a respective chip pad via a respective wire.

9. The image sensor package as claimed in claim 8, wherein the bonding layer covers the chip pads, the base chips, and the wires so as to integrate the base, the image sensor chip, and the imaging lens into a whole.

10. The image sensor package as claimed in claim 3, wherein each projector has a height substantially equal to a height of the image sensor chip with respect to the substrate.

11. The image sensor package as claimed in claim 1, wherein the imaging lens is selected from the group consisting of: an aspheric lens, a spherical lens and a converging lens.

12. The image sensor package as claimed in claim 1, wherein the imaging lens comprises a centric optical portion and a peripheral non-optical portion; the optical portion is a vaulted structure and the bottom of the centric optical portion is spaced from the photosensitive area at a predetermined distance for forming the sealed interspace.

13. The image sensor package as claimed in claim 12, wherein the non-optical portion of the imaging lens is adhered onto the bonding layer.

14. A method of manufacturing an image sensor package, the method comprising steps of:
   providing a base;
   assembling an image sensor chip on the base, the image sensor chip comprising a photosensitive area;
   disposing a bonding layer on at least one of the image sensor chip and the base, the bonding layer surrounding the photosensitive area; and
   adhering an imaging lens onto the bonding layer, the imaging lens cooperating with the bonding layer to hermetically seal the photosensitive area and a sealed interspace being formed between the bottom of the imaging lens and the image sensor, the sealed interspace being sealed using the bonding layer and not filled with solid material.

15. The method as claimed in claim 14, wherein the assembling of the image sensor chip on the base is performed by a package process selected from the group consisting of: a chip-scale package process, a wafer-level chip-scale package process, a ceramic leaded package process, a plastic leadless chip package process, a thermal compression bonding process, and a flip chip package process.

16. The method as claimed in claim 14, further comprising a step of forming a plurality of projectors protruding out of edges of a substrate of the base along a direction substantially perpendicular to an optical axis of the imaging lens.

17. The method as claimed in claim 16, wherein the projectors are formed by a co-molded method with the substrate.

18. An image sensor package comprising:
   a base;
   an image sensor chip disposed on the base, the image sensor chip comprising a photosensitive area and a non-photosensitive area surrounding the photosensitive area;
   a bonding layer disposed on the non-photosensitive area of the image sensor chip and the base; and an imaging lens configured to form images at the photosensitive area of the image sensor chip and adhered to the bonding layer, the imaging lens cooperating with the bonding layer to hermetically enclose the photosensitive area and a sealed interspace being formed between the bottom of the imaging lens and the image sensor, the sealed interspace being sealed using the bonding layer and not filled with solid material.

19. The image sensor package as claimed in claim 18, wherein a plurality of chip pads is disposed on the non-photosensitive area of the image sensor chip, a plurality of base pads is disposed on the base, each base pad being electrically connected to a respective chip pad via a wire, the bonding layer covering the chip pads, the base pads and the wires.

20. The image sensor package as claimed in claim 19, wherein the base comprises a substrate and a projector protruding from a peripheral edge of the substrate along a direction substantially parallel to an optical axis of the imaging lens, the projector being apart from and surrounding the image sensor chip such that an interspace is formed therebetween, the bonding layer being filled in the interspace to a point where it over-brims the interspace, the base pads being disposed on the projector; the wire being electrically connected between the base pads of the projector and the image sensor chip, and the wire parallel to the substrate.

21. The image sensor package as claimed in claim 20, wherein the imaging lens comprises a centric optical portion and a peripheral non-optical portion; the peripheral non-optical portion is supported by the wire paralleled connected between the base pads of the projector and the image sensor chip.

22. The image sensor package as claimed in claim 21, wherein the optical portion is a vaulted structure and the bottom of the centric optical portion is spaced from the photosensitive area at a predetermined distance for forming the sealed interspace.

* * * * *